(12) United States Patent
Raino et al.

(10) Patent No.: US 10,008,820 B2
(45) Date of Patent: Jun. 26, 2018

(54) OPTICALLY PUMPABLE WAVEGUIDE AMPLIFIER WITH AMPLIFIER HAVING TAPERED INPUT AND OUTPUT

(71) Applicant: INTERNATIONAL BUSINESS MACHINES CORPORATION, Armonk, NY (US)

(72) Inventors: Gabriele Raino, Zurich (CH); Ibrahim Murat Soganci, Zurich (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 14/907,110

(22) PCT Filed: Jul. 15, 2014

(86) PCT No.: PCT/IB2014/063117
§ 371 (c)(1),
(2) Date: Jan. 22, 2016

(87) PCT Pub. No.: WO2015/011606
PCT Pub. Date: Jan. 29, 2015

(65) Prior Publication Data
US 2016/0156147 A1 Jun. 2, 2016

(30) Foreign Application Priority Data
Jul. 25, 2013 (GB) .................................. 1313282.4

(51) Int. Cl.
*H01S 3/063* (2006.01)
*H01S 3/16* (2006.01)
(Continued)

(52) U.S. Cl.
CPC .............. *H01S 3/063* (2013.01); *G02B 6/125* (2013.01); *G02B 6/1228* (2013.01);
(Continued)

(58) Field of Classification Search
CPC ........ H01S 3/091; H01S 3/063; H01S 3/0637; H01S 3/2308; G02B 6/125; G02B 6/1228
See application file for complete search history.

(56) References Cited

U.S. PATENT DOCUMENTS

| 5,381,262 | A | 1/1995 | Arima et al. |
| 6,549,688 | B2 | 4/2003 | Bazylenko |

(Continued)

FOREIGN PATENT DOCUMENTS

| CN | 1564406 A | 1/2005 |
| CN | 1647332 A | 7/2005 |

(Continued)

OTHER PUBLICATIONS

Grivas, Christos, Optically pumped planar waveguide lasers, Part I: Fundamentals and fabrication techniques, Progress in Quantum Electronics, Nov. 2011, pp. 159-239, vol. 35—Iss. 6, Elsevier B.V., Southampton, UK. <http://www.sciencedirect.com/science/article/pii/S0079672711000139/>.

(Continued)

*Primary Examiner* — Eric L Bolda
(74) *Attorney, Agent, or Firm* — Rabin Bhattacharya

(57) ABSTRACT

Optically pumpable waveguide amplifier with amplifier having tapered input and output. The present invention provides for a optically pumpable waveguide amplification device that includes: a cladding material; a passive optical waveguide embedded in the cladding material that has no optical amplification functionality; and an active optical waveguide having an input portion, a middle portion and an output portion, including: a gain material with a higher refractive index than the passive optical waveguide, wherein the middle portion of the active optical waveguide is embedded in the cladding material, and faces the passive wave guide, such that a lower surface of the middle portion is an upper surface of the passive optical waveguide. There is also (Continued)

provided a device for optically pumpable waveguide amplification and a method for signal radiation amplification.

16 Claims, 4 Drawing Sheets

(51) Int. Cl.
  *G02B 6/122* (2006.01)
  *G02B 6/125* (2006.01)
  *H01S 3/091* (2006.01)
  *H01S 5/04* (2006.01)
  *H01S 3/23* (2006.01)
(52) U.S. Cl.
  CPC ............ *H01S 3/0637* (2013.01); *H01S 3/091* (2013.01); *H01S 3/169* (2013.01); *H01S 5/041* (2013.01); *H01S 3/2308* (2013.01)

(56) References Cited

U.S. PATENT DOCUMENTS

| | | | |
|---|---|---|---|
| 6,798,815 B2 | 9/2004 | Schmidt et al. | |
| 6,975,798 B2 * | 12/2005 | Blauvelt | B82Y 20/00 385/129 |
| 2003/0165007 A1 | 9/2003 | Frolov et al. | |
| 2004/0081415 A1 | 4/2004 | Demaray et al. | |
| 2004/0264905 A1 * | 12/2004 | Blauvelt | G02B 6/1228 385/131 |
| 2005/0185889 A1 * | 8/2005 | Xia | B82Y 20/00 385/43 |
| 2006/0182402 A1 * | 8/2006 | Blauvelt | G02B 6/12002 385/131 |
| 2007/0110357 A1 | 5/2007 | Forrest et al. | |
| 2008/0273570 A1 * | 11/2008 | Moench | H01S 3/0632 372/71 |
| 2011/0228382 A1 | 9/2011 | Mattsson et al. | |
| 2012/0262781 A1 | 10/2012 | Price et al. | |

FOREIGN PATENT DOCUMENTS

| | | |
|---|---|---|
| CN | 101122726 A | 2/2008 |
| EP | 0561672 A1 | 9/1993 |
| EP | 1030413 A1 | 8/2000 |
| JP | H09288287 A | 11/1997 |
| JP | 2004250251 A | 9/2004 |
| WO | 2015011606 A1 | 1/2015 |

OTHER PUBLICATIONS

Xia et al., "Monolithic Integration of a Semiconductor Optical Amplifier and a High Bandwidth p-i-n. Photodiode Using Asymmetric Twin Waveguide Technology", IEEE Photonics Technology Letters, Mar. 2003, p. 452-454, vol. 15, No. 3.

* cited by examiner

OPTICALLY PUMPABLE WAVEGUIDE AMPLIFIER WITH AMPLIFIER HAVING TAPERED INPUT AND OUTPUT

CROSS-REFERENCE TO RELATED APPLICATION

This application claims priority from PCT Application PCT/IB2014/063117 under 35 U.S.C. §371, filed on Jul. 15, 2014, which claims priority from United Kingdom Application No. 1313282.4, filed Jul. 25, 2013. The entire contents of both applications are incorporated herein by reference.

TECHNICAL FIELD OF THE INVENTION

The invention relates in general to the field of optically pumped waveguide amplifier devices and related devices and methods.

BACKGROUND OF THE INVENTION

Optical amplifiers compensate for the losses in optical communication channels by increasing the signal power. Erbium-doped fiber amplifiers (EDFA) are important to optical communications and have enabled transmission of large amounts of data over long distances. Planar optical waveguide amplifiers are expected to reach widespread usage in the future as a result of the increased utilization of integrated photonics. In particular, polymer waveguide technology is expected to increase chip/board level communication capacity at low assembly cost and will have a profound impact on the growing field of silicon photonics. However, due to the restricted power budget, amplification of the optical signal can be required. Polymer waveguide amplifiers usually make use of optical pumping for operation. These amplifiers operate with a pump light, which have a shorter wavelength than the signal light. The absorption of the pump light leads to population inversion, and consequently to amplification by stimulated emission.

Along with several other important characteristics, an ideal optically-pumped waveguide amplifier should include some key characteristics. First, the optical signal should have large overlap with the gain material in the active waveguide for an efficient amplification. The modal gain is proportional to this overlap value. Second, the overlap integral between the signal and the pump modes should be large to make use of population inversion efficiently. Third, outside the amplifier, the pump has to be separated from the signal efficiently. Also, the amplifier should preferably not deteriorate the optical characteristic of the passive waveguide (e.g. propagation loss should not increase). Last, it is preferable to have high tolerance to variations of the device geometry and material characteristics compared to the nominal design specs. This reduces the cost by increasing the yield and relaxing process parameters.

State-of-the-art optically pumped waveguide amplifiers can satisfy only some of these requirements. The coupling and separation of the pump and the signal is obtained by using devices, such as interferometers or directional couplers, which do not have high tolerance because of their resonant operating conditions. Most of them make use of rare earth-doped polymers as gain material. This imposes stringent boundary conditions on design due to their narrow absorption band and the limited concentration caused by the tendency of these materials to form aggregates.

The prior art has important limitations. For example, U.S. Pat. No. 6,549,688 describes an optical amplifier design, which makes use of asymmetric Mach-Zehnder interferometers to multiplex and demultiplex the pump and the signal. Adiabatic couplers are proposed for coupling between different types of waveguides. These couplers do not separate the pump from the signal. Also, US 2004/0081415 describes a planar optical waveguide amplifier, in which the signal couples between the active and passive waveguides with the help of a directional coupler. U.S. Pat. No. 5,381,262 describes an optical waveguide amplifier, which includes partial erbium doping in the waveguide where the signal propagates. The pump light is coupled to the waveguide amplifier with the help of a directional coupler. In addition, EP 0,561,672 describes a waveguide amplifier, in which a gain region is obtained by doping and the pump signal is coupled in and out of the amplifier using directional couplers. Owing to a precise directional coupler design, coupling length for the signal wavelength is half of that for the pump wavelength. Therefore, the signal remains on a same waveguide, whereas the pump signal switches between waveguides. EP 1,030,413 describes a rare-earth-doped planar waveguide positioned on top of a passive waveguide. The rare-earth-doped waveguide is tapered, perpendicularly to the planar direction, to couple the pump and the signal between the waveguides. The coupler does not separate the pump from the signal. An external component is provided to separate the pump.

SUMMARY OF THE INVENTION

The present invention provides an optically pumpable waveguide amplification device. The device includes: a cladding material; a passive optical waveguide embedded in the cladding material that has no optical amplification functionality; and an active optical waveguide having a gain material with a higher refractive index than the passive optical waveguide, and which successively includes: an input portion, a middle portion, and an output portion. The middle portion successively includes: a first taper portion, an amplifier portion, and a second taper portion, wherein the middle portion is embedded in the cladding material and faces the passive waveguide, such that a lower surface of the middle portion is an upper surface of the passive optical waveguide. Also, each of the taper portions widens towards the amplifier portion, parallel to the lower surface, such that a narrow end of each of the taper portions have a cross-sectional area that is smaller than a cross-sectional area of the passive optical waveguide at the same level of narrow end.

Furthermore, the present invention provides a method for signal radiation amplification. The method includes the steps of: coupling a signal to be amplified from the passive optical waveguide to the active optical waveguide of an optical waveguide amplification device at a first tape portion of the device through adiabatic mode transformation; allowing a pump signal and the signal to be amplified to propagate in the amplifier portion of the optical waveguide amplification device; and coupling the amplified signal back to the passive optical waveguide at the level of a second taper portion of the optical waveguide amplification device.

The present invention further provides for an optically pumpable waveguide amplification device. The device includes: a cladding material; a passive optical waveguide embedded in the cladding material that has no optical amplification functionality; and an active optical waveguide having an input portion, a middle portion and an output portion, including: a gain material with a higher refractive index than the passive optical waveguide, wherein the middle portion of the active optical waveguide is embedded in the cladding material, and faces the passive wave guide, such that a lower surface of the middle portion is an upper surface of the passive optical waveguide.

Figure 8:
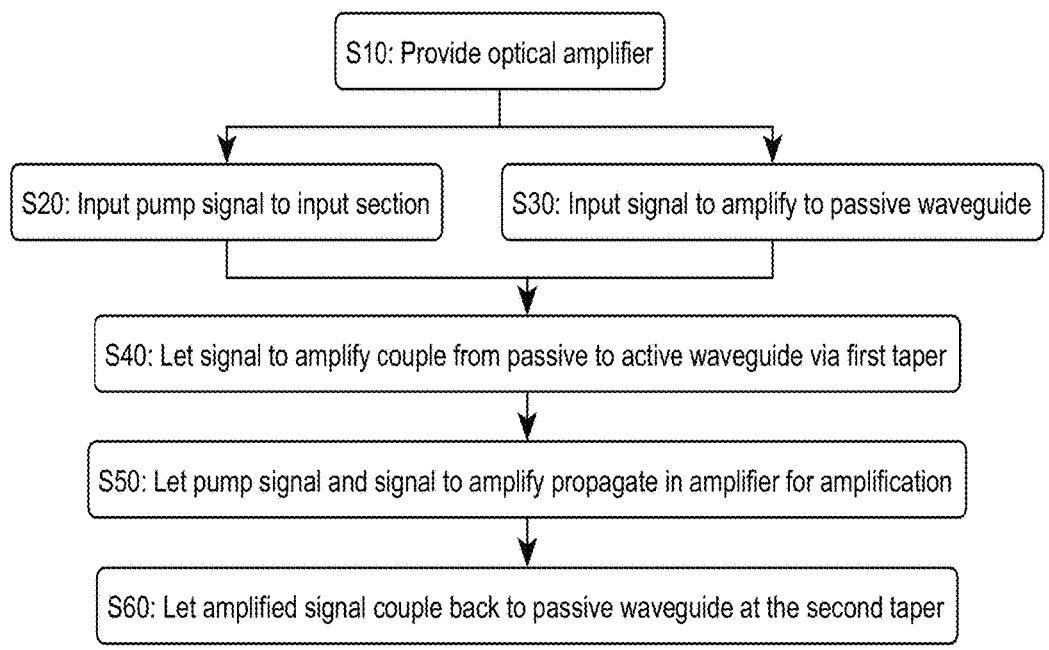
Figure 9:
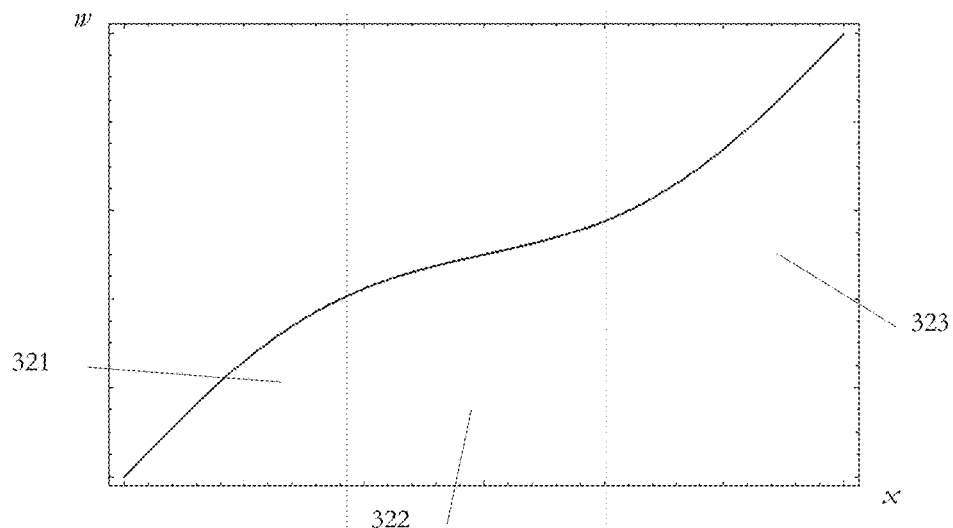

F) at the inner (left-hand column) and outer (right-hand column) sides of a tapered section, illustrating how a signal is transferred between the active and passive waveguides, whereas a pump signal remains in the active waveguide;

FIG. 8 is a flowchart illustrating high-level steps of a method of amplification, according to embodiments; and FIG. 9 schematically illustrates the variation of the width of a non-linear taper portion along its longitudinal axis, according to specific embodiments.

DETAILED DESCRIPTION OF THE PREFERRED EMODIMENTS

Some preferred embodiments will be described in more detail with reference to the accompanying drawings, in which the preferable embodiments of the present invention have been illustrated. However, the present invention can be implemented in various manners, and thus should not be construed to be limited to the embodiments disclosed herein. On the contrary, those embodiments are provided for the thorough and complete understanding of the present invention, and to completely convey the scope of the present invention to those skilled in the art.

Referring to FIGS. 1-6, the present invention is an optically pumpable waveguide amplifier device 100. The device includes: cladding material 10, passive optical waveguide 20, and active optical waveguide 30. The waveguides 20, 30 are at least partially embedded in cladding material 10 and can be referred to as waveguide cores 20, 30 in the alternative. Passive waveguide 20 has no optical amplification functionality, whereas active optical waveguide 30 includes: a gain material having a higher refractive index than the passive optical waveguide.

The active waveguide successively includes: an input portion 31, a middle portion 32-34, and an output portion 35. The middle portion 32-34 decomposes itself into: a first taper portion 32; an amplifier portion 33; and a second taper portion 34. The portions are successive, but that does not necessarily exclude other intermediate sections, between the portions. However, the preferred embodiments include successions of portions and only such portions, as indicated above.

The middle portion is embedded in the cladding material 10; it faces the passive waveguide 20, i.e., a lower surface S1 of the middle portion is vis-à-vis an upper surface S2 of the passive waveguide 20. The terms "lower" or "upper" surfaces imply a relative configuration of the two surfaces, i.e., the layout could obviously be reversed with the passive waveguide above the active waveguide. In addition, the two surfaces S1 and S2 need not be in contact. As seen in FIGS. 2-5, some material can be provided between the two waveguides, where the transverse distance is typically between 0 and 5 μm.

The portions 32, 34 are meant to act as couplers, as discussed later. They are tapered in-plane, where each taper 32, 34 widens towards the amplifier portion 33 in a plane that is parallel to the lower surface S1. The narrow end of each of the tapers has a cross-sectional area that is smaller than the cross-sectional area of an opposite section of the passive waveguide 20 at the level of the narrow end. In other words, the width of the first taper portion 32 increases from an end of the input portion 31 to a first end of the amplifier portion, and the width of the second taper portion 34 decreases from a second end of the amplifier portion 33 to an end of the output portion 35 (from left to right in FIG. 1 or 6), such that the innermost width of each of the taper portions 32, 34 is larger than its outermost width. Preferably, amplifier portion 33 is straight, its width corresponds to that of the tapers at their wide end, and the thickness is the same as the thickness of the tapers 32, 34 and other portions of the active waveguide. Other shapes for the amplifier portion can be contemplated such as a ring, spiral or simply bended waveguides. The input and output portions can for instance have the same width as the tapers at the level of their narrow end.

Whereas the middle portion extends above the passive waveguide 20, the input and output portions are not necessarily superimposed to the passive waveguide. Furthermore, the input and output portions need not necessarily be embedded in the cladding, contrary to the middle portion. In that respect, it should be noted that, notwithstanding the primary role played by the middle portion 32-34, the active waveguide 30 extends beyond the couplers 32, 34 in the present case, owing to the input and the output sections 31, 35, which allow for inputting and collecting optical signal.

Notably, the pump signal is meant to be input to the amplifier portion 33 through the active waveguide, via the input portion 31.

The gain material is embedded in the active waveguide 30 as a whole and the input and output sections contain gain material. Gain materials are materials that can be pumped at a wavelength, which typically is 60 to 80% of the signal wavelength or shorter. These are approximate numbers, as usually considered in the art, as there is no sharp boundary defined. As the pump wavelength approaches the signal wavelength, it becomes more difficult to achieve high extinction ratio for the pump and low active-passive coupling loss for the signal simultaneously.

As present inventors have realized, such a design and in particular the taper orientation allow for adiabatic optical coupling of a signal radiation from the passive waveguide 20 to the active waveguide 30 at the level of the input portion and then from the active waveguide 30 to the passive waveguide 20 at the level of the output portion, while not enabling inter-waveguide optical coupling of the pump radiation. As a result, the present invention enables amplification of the signal radiation and an efficient filtering of the pump radiation, without requiring any additional filter or demultiplexer. Accordingly, a device 100 according to embodiments is preferably deprived of any additional filter to separate the pump signal from the signal of interest.

Adiabatic optical coupling is known per se. Adiabaticity condition is met when the optical distribution is defined by the same eigenmode (i.e., supermode) of the coupled waveguide system (e.g., fundamental even supermode, fundamental odd supermode) throughout the taper, with minimal scattering to other supermodes or radiation modes. In the present case, the supermode profile is transformed along the coupler through a taper 32, 34. It overlaps mostly with the passive waveguide 20 at the input of the first taper 32 and at the output of the taper 32 it is mainly confined in the active waveguide 30. In this way, inter-waveguide coupling is achieved without any resonance conditions. The situation is reversed at the second taper 34: the supermode is transferred from the active waveguide to the passive waveguide.

The aforementioned scattering loss is never perfectly zero. Adiabaticity is a relative term, as known. A coupler is considered to be adiabatic when the loss is below a predefined level, e.g. less than 15%, but typically less than 10%. At least some of the present embodiments allow for achieving losses that are less than 5%.

The present invention provides a method of amplification. Referring to FIG. 8, this method includes the following steps. In Step S10, an optical waveguide amplifier device is provided. Next, at Step S20 and S30, a pump signal is provided to amplifier portion 33 via input portion 31. Concomitantly, a signal to be amplified is provided to the passive waveguide 20. Both signals are input in parallel, i.e., from left to right in FIG. 1 or 6. At Step S40, the signal to be amplified couples from the passive waveguide 20 to the active waveguide 30 at the level of the first taper portion 32, which involves adiabatic mode transformation. In Step S50, the pump signal and the signal to be amplified both propagate in the amplifier portion 33 where amplification takes place. Last, at Step S60, the amplified signal couples back to the passive waveguide 20 at the level of the second taper portion 34.

Figure 1:
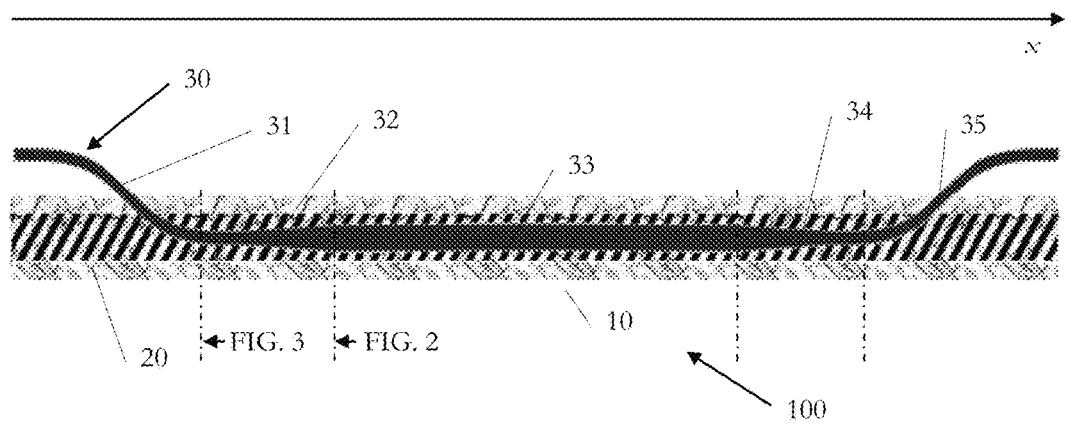
FIG. 1 is a top view of a simplified representation of an optical waveguide amplifier, according to embodiments.
Figure 6:
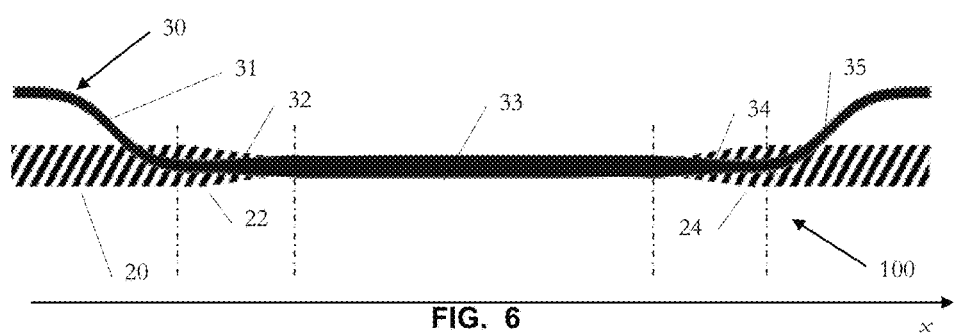
FIG. 6 is a top view of a simplified representation of a variant to FIG. 1, wherein the passive waveguide to include tapered sections, oriented opposite to the tapered sections of the active waveguide, according to still other embodiments.

Referring now to FIGS. 1, 6, in various embodiments of the present invention, the width of each of the taper portions 32, 34, as taken in a plane parallel to the lower surface S1, decreases non-linearly from the amplifier portion to the narrow end of the tapers 32, 34. As it can be realized, some types of non-linear tapers ensure lower, possibly minimal coupling losses in a more compact layout/shorter length. This is because a suitable design allows a smoother transformation of the optical mode ensuring minimal scattering to the unwanted modes. Nonlinear taper designs can for instance include parabolic segments. Further investigations on this matter have shown that a parabolic shape is not the most optimal geometry. Still, it can be regarded as an approximation to the optimal geometry, and at least as a better approximation than linear tapers.

In preferred embodiments, each of the taper portions 32, 34 decomposes into at least two sub-portions, whose respective widths as measured in a plane parallel to the lower surface S1 vary quite differently. In other words, the derivative of the width w varies substantially even though the width w of the taper constantly increases along axis x (e.g., a factor of at least 3 is observed between the lowest and highest values of the derivative). Formally, each of the taper portions 32, 34 decomposes into at least two sub-portions including at least one fast-varying sub-portion 321, 323 and at least one slow-varying sub-portion 322 (see FIG. 9). Preferably, a taper portion decomposes into three sub-portions 321, 322, 323. Namely, it decomposes into a fast-varying sub-portion 321, followed by a slowly-varying sub-portion 322, itself followed by a fast-varying sub-portion 323. The average angle in a fast-varying sub-portion can, for instance, be at least 3 times larger than an average angle in a slowly-varying sub-portion. The average angle means an average of tangential angles observed in a given sub-portion, measured in a plane parallel to said lower surface (S1). A tangential angle is the angle between a tangent line to an edge of a given sub-portion and a longitudinal axis x of the taper portion.

For instance, a "slow" variation (i.e., small angle with respect to the longitudinal axis of the taper portion) can be provided in the middle sub-portion 322 of a taper portion 32, and the taper angle increases towards both ends of the taper portions. In the slowest region, the taper angle can be smaller than 0.1 degrees. On the other hand, the angle can be significantly larger (i.e., larger than 1 degree) in the "faster" regions. FIG. 9 is not to scale for purposes of clarity since actual angles are much smaller than the angles depicted.

The various embodiments of the present invention can be realized using a single non-linear taper section or using multiple taper sections such as a linear section followed by a non-linear section, itself followed by a linear section, etc. Preferred designs of the taper depend on the coupling efficiency target, geometry and refractive indices of the waveguides, and the size limitations. Depending on the available fabrication techniques, it can be more practical to approximate a non-linear taper portion by multiple successive linear sub-portions.

Adiabaticity was explored in the prior art. An analytical formula describing tapers having optimal designs was derived in the prior art. Also, the prior art defines adiabaticity criterion and the shortest adiabatic mode transformer in a coupled waveguide system. In particular, the reader is referred to parameters defined by the coupled mode theory.

Referring now to FIG. 6, the passive waveguide 20 can include taper portions 22, 24. Note that in FIG. 6, the cladding 10 is not represented for clarity. Each of said taper portions 22, 24 face a taper portion 32, 34 of the active waveguide 30. However, taper portions 22, 24 have reverse orientation compared to taper portions 32, 34, such that taper portions 22, 24 narrow inwardly in a plane parallel to the upper surface S2. This additional feature is believed to enhance the coupling properties. As a result, the cross-sectional area of the portion of the passive waveguide 20 that faces the amplifier portion 33 is smaller than the cross-sectional area of outermost portions. The passive waveguide can be interrupted at the level of the amplifier portion since both the signal to be amplified and the pump signal propagate through the active waveguide at this stage. In this case, the passive waveguide 20 decomposes into two passive waveguide components, where one terminates at the narrow end of the first taper portion 22 and the other component terminates at the narrow end of the second taper portion 24 of the passive waveguide. However, such a limit case may not be optimal. From the fabrication perspective, it may be easier to keep a thin portion of passive waveguide facing the amplifier portion 33. This also would mitigate the risk of spurious effects such as those caused by fabrication defects at the end of the taper portions 22, 24. The dimensions of the taper portions 22, 24 are typically similar to those of taper portions 32, 34.

Figure 4:
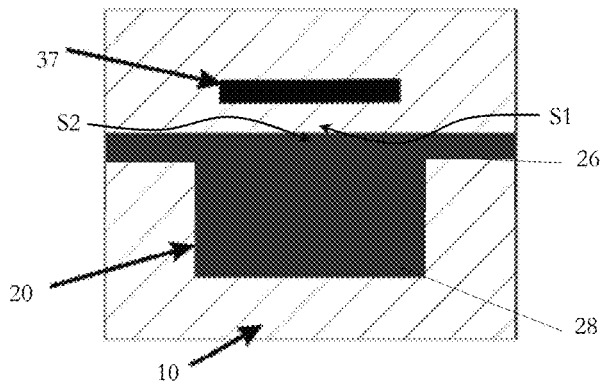
FIG. 4 is a 2D cross-sectional view of the optical waveguide amplifier device as it is before a tapered section, where the passive waveguide is a rib waveguide.
Figure 5:
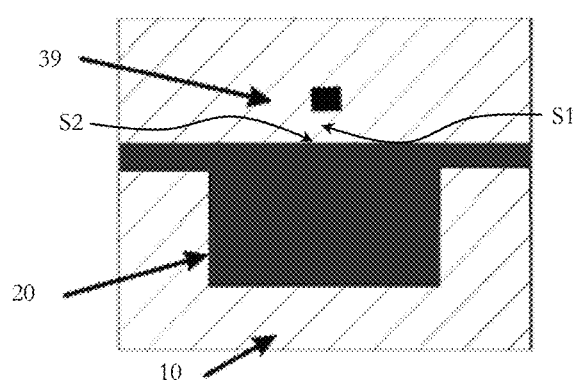
FIG. 5 is a 2D cross-sectional view of the optical waveguide amplifier device after a tapered section, where the passive waveguide is a rib waveguide.

Referring now to FIGS. 4, 5, it is of particular advantage to design the lower waveguide 20 as an inverted rib waveguide by including a slab 26 and a strip 28 superimposed directly onto the slab. The upper surface S2 of the passive waveguide 20 is in that case an upper surface of the slab 26 located opposite to the strip 28 with respect to the slab 26. In other words, the passive waveguide exhibits a T-shape. Both the slab and the strip are preferably made of the same material. The thickness of the slab 26 is typically smaller than ⅓ of the total thickness of the inverted rib waveguide. The thickness of the slab can vary significantly depending on the waveguide fabrication technology and the design.

In the present context, using an inverted rib waveguide is advantageous in terms of fabrication process. It allows for obtaining a uniform, flat surface for a layer of cladding material deposited on top of the slab. This, in turn, allows for depositing or arranging the active waveguide 30 above this layer of cladding material. The resulting waveguide 30 extends parallel to the passive waveguide. Enhanced coupling properties result in fine.

The distance between the lower surface S1 and the upper surface S2 is typically between 0.0 and 5.0 μm as seen FIGS. 2-5. The length of the taper portions 22, 24 or 32, 34 are typically between 50 μm and 10 mm, which allows for exceeding adiabaticity limits in practice. The length of the amplifier portion 33 can be between 100 μm and 100 cm depending on the context and desired amplification.

The gain material of the active waveguide can include a dispersion of gain elements, such as dye molecules, rare-earth ions (e.g., Er3+ ions) or nanocrystals. The latter are preferably designed as quantum dots or quantum rods embedded in a polymer matrix. For instance, the gain material can include a colloidal dispersion of nanocrystals in a core or core-shell configuration (e.g., nanocrystals including group II-VI, IV-VI, III-V or IV semiconductor materials).

In terms of optical properties, the gain material in the active waveguide 30 has a higher refractive index than the passive waveguide 20. In addition, the refractive index contrast between the passive waveguide and the cladding material is typically between 0.005 and 0.02.

The original aspects of the embodiments of the present invention described above reside in the design of active waveguide 30 that includes in-plane tapering portions 32, 34, which couple the optical signal efficiently, but do not couple the pump signal. The signal couples to active waveguide 30 at input taper portion 32, propagates in gain material 33, and couples back to passive waveguide 20 at output taper portion 34. The pump light remains in the active waveguide such that no additional filter is required to separate the pump from the signal of interest. As explained in the following section, such couplers have an easy design and a high tolerance to design parameters. There are other advantages of the various embodiments of the present invention. For instance, the design of the coupler produces: a substantial confinement of the optical signal within the active waveguide and a substantial overlap between the pump and the signal. Also, there is efficient separation of the pump signal from the optical signal at the output without using external components, such as filters or demultiplexers. The vertical twin waveguide approach allows little to no perturbation to the characteristics and the fabrication process of the passive waveguide. Furthermore, the use of an adiabatic mode transformation instead of directional coupling based on resonant conditions allows for large tolerance to variations of the refractive indices and dimensions, and positional inaccuracy.

The above embodiments have been succinctly described in reference to the accompanying drawings and can accommodate a number of variants. Several combinations of the above features can be contemplated. Examples are given in the next section.

FIG. 1 shows the schematic layout of the amplifier 100. At the input 31 of the amplifier, the active waveguide 30 approaches the passive waveguide 20 (and vice versa). Active and passive waveguides stay in proximity for a minimum length, for inter-waveguide optical coupling. In the region of the first taper 32, the width of the active waveguide increases gradually, in-plane, to couple the signal from the passive waveguide 20 to the active waveguide 30, and this, by way of adiabatic mode transformation. At the end of the first coupler 32, the signal and the pump both propagate in the amplifier region 33. This is the region where amplification begins to takes place. At the end of the amplifier portion 33 (which can include spirals, etc.), another coupler 34 transfers the signal back to the passive waveguide 20, as explained in the previous section. The couplers 32, 34 proposed herein favor adiabatic mode conversion.

FIGS. 7A-7F show the refractive indices (FIGS. 7A, D) and mode profiles (7B, C, E, F) at the inner (left-hand column) and outer (right-hand column) sides of a tapered section 32. The results of FIG. 7 have been obtained by optical mode simulation using the film mode matching method for the transverse-electric (TE) polarization of radiation. As an example, the active waveguide composed of colloidal quantum dots embedded in a Poly(methyl methacrylate) (PMMA) matrix. For the present example, a quantum dot volume ratio of 10.0% (volume quantum dot/total volume). The refractive index of the quantum dot layer is 2.3, while PMMA has a refractive index of 1.48. By linear interpolation, it can be assumed that the effective refractive index of the active waveguide to be 1.56 (2.3·0.1+1.48·0.9). For the core of the passive waveguide, the refractive index used in the simulation is 1.525. The refractive index of the cladding material used in the simulations is 1.517. The geometrical design parameters used in the mode simulations are as follows. The passive waveguide has a constant width of 8 μm and a thickness of 4 μm. The thickness of the cladding between the active and passive cores is 0.5 μm, and the thickness of the active waveguide core is 0.75 μm. The width of the active waveguide core is 8 μm at the wide end of the taper and 0.75 μm at the narrow end.

Figure 2:
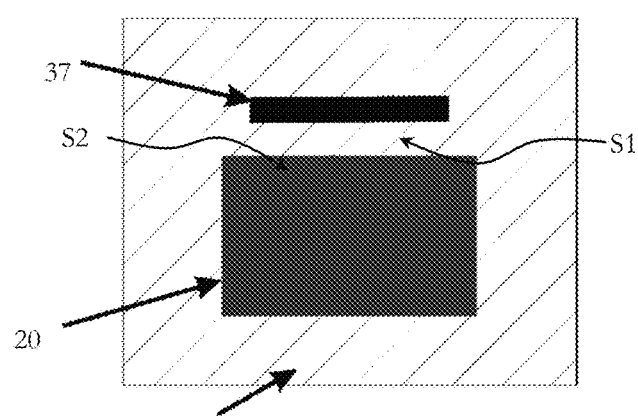
FIG. 2 is a 2D cross-sectional view of a simplified representation of the optical waveguide amplifier device as it is before a tapered section.
Figure 3:
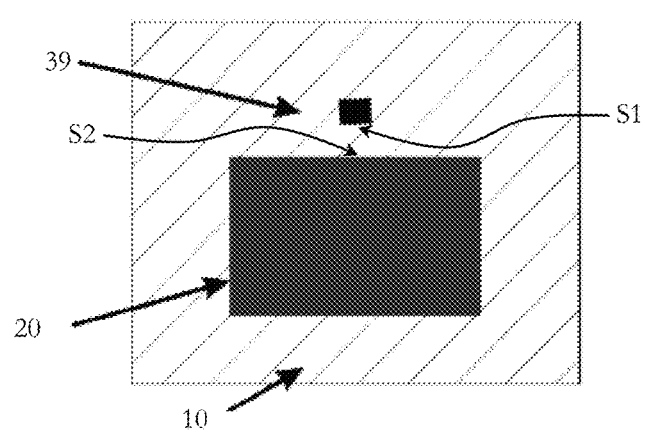
FIG. 3 is a 2D cross-sectional view of a simplified representation of the optical waveguide amplifier device after a tapered section.

The active waveguide 30 is wide at the inner side of the couplers 32, 34 (output of the first taper 32 and input of the second taper 34) and narrow at their outer side, see e.g., FIGS. 1-3. The active waveguide 30 (core) has a higher refractive index than the passive waveguide 20, as seen in FIGS; 7A, D. FIG. 7B depicts a fundamental mode profile at a wavelength of 400 nm (pump signal), inputted to the active waveguide 30 via the input section 31. FIG. 7C shows the fundamental mode profile at the wavelength of 1550 nm (signal) at the end of the taper 32 and the beginning of the taper 34. Therefore, the eigenmode of the coupled waveguide system (supermode) is confined in the active waveguide 30 at both pump and signal wavelengths when the active waveguide is wide. On the other hand, when the active waveguide is narrow, the supermode profiles at the pump and signal wavelengths are considerably different (FIG. 7E, F). The pump light at 400 nm (FIG. 7E) is confined in the active waveguides, whereas the signal at 1550 nm is essentially confined in the passive waveguide 20. The signal is affected by tapering much more than the pump because of its longer wavelength. If the mode transformation between the mode profile plotted in FIG. 7C and the one plotted in FIG. 7F is provided adiabatically, the signal is transferred between the active waveguide 30 and the passive waveguide 20 with high efficiency, whereas the pump signal remains confined in the active waveguide 30.

Figure 7:
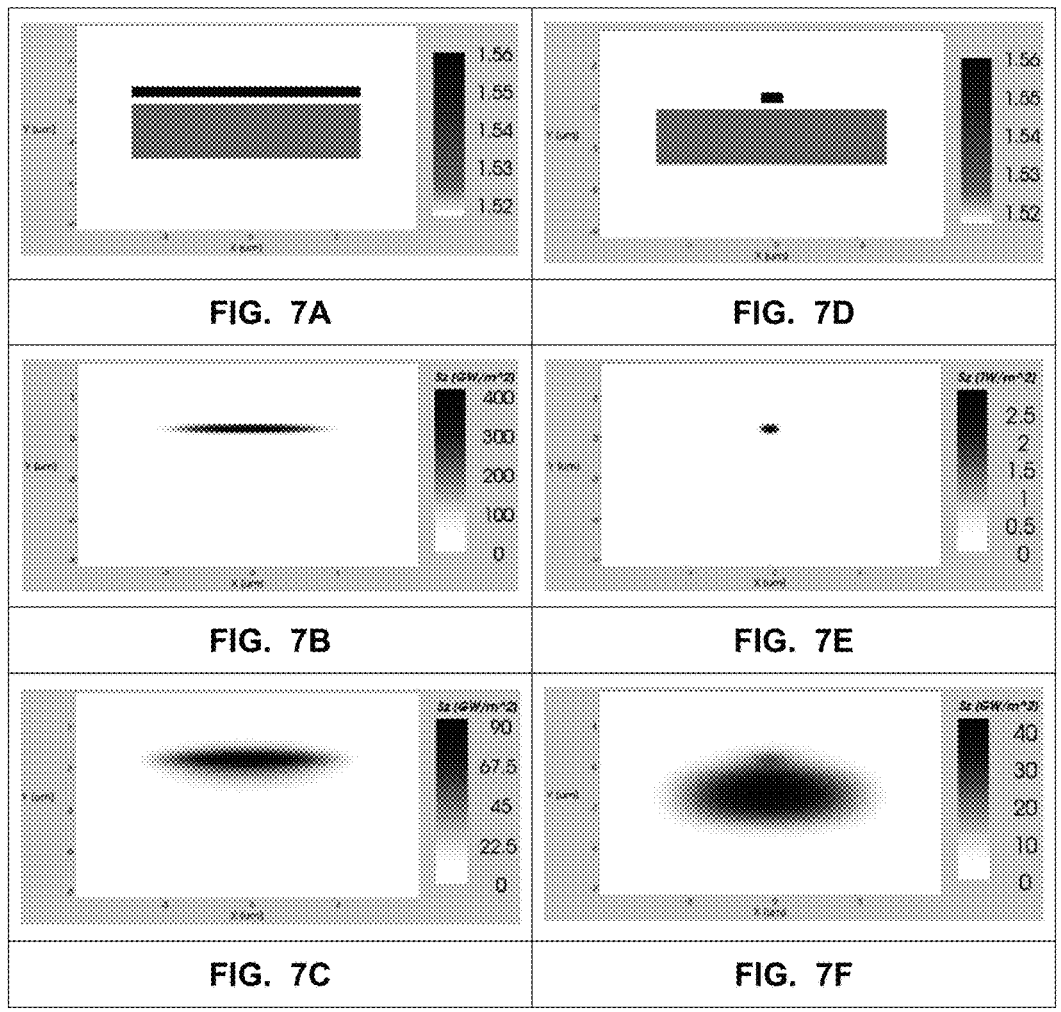
FIG. 7A shows a refractive index of the optical waveguide amplifier device.
FIG. 7B shows a mode profile at the inner side of a tapered section, illustrating how a signal is transferred between the active and passive waveguides, whereas a pump signal remains in the active waveguide.
FIG. 7C shows a mode profile at the inner side of a tapered section, illustrating how a signal is transferred between the active and passive waveguides, whereas a pump signal remains in the active waveguide.
FIG. 7D shows a refractive index of the optical waveguide amplifier device.
FIG. 7E shows a mode profile at the outer side of a tapered section, illustrating how a signal is transferred between the active and passive waveguides, whereas a pump signal remains in the active waveguide.
FIG. 7F shows a mode profile at the inner side of a tapered section, illustrating how a signal is transferred between the active and passive waveguides, whereas a pump signal remains in the active waveguide.

In the example of FIG. 7, the power overlap between the pump signal (400 nm) and the signal to be amplified (1550 nm) is ~45%. The extinction ratio of the pump signal (400 nm) at the end of taper 34 is higher than 25 dB. This is the ratio between the pump radiation power in the active waveguide at the inner side of taper 34 and the residual pump power in the passive waveguide at the outer side of taper 34. As the pump wavelength gets longer, the overlap between the pump mode and the signal mode increases in the amplifier portion, whereas the extinction ratio of the pump radiation reduces. The pump wavelength can be optimized based on the design specifications. The coupler loss at the signal wavelength (1550 nm) shall approach 0.01 dB for nearly ideal adiabatic coupling.

Typical lengths of the couplers 32, 34 can for instance be between 50 μm and 10 mm (but more preferably between a few hundred micrometers to a few millimeters). Adiabatic couplers do not have an optimal length. The loss of adiabatic couplers is insensitive to the length provided the taper is longer than the adiabaticity limit. If the couplers 32, 34 are designed with a safety margin above the adiabaticity limit, the coupler efficiency is insensitive to variations of dimensions, refractive index, etc.

Concerning the dimensions: adiabatic couplers as contemplated herein can have a few micrometers of tolerance to the misalignment between waveguides. Assume that $\lambda$ is the free-space wavelength of the signal radiation. The cross-sectional dimensions depend on the refractive indices of the materials. The refractive index contrast between the core and the cladding of the passive waveguides can have a very broad range of values. Suitable values are in the range of 0.005-0.02, as noted earlier. The active waveguide core 30 should have a higher refractive index than the passive waveguide core 20 for the disclosed couplers to function. The thickness and the width of the passive waveguide core can typically vary between $\lambda$ and $6\lambda$, preferred values being approximately $3\lambda$-$4\lambda$. The passive waveguide shall preferably be a buried channel waveguide (rectangular core buried in the cladding 10), but it can also be an inverted rib waveguide (thin slab with a rectangular protrusion), as discussed earlier.

At the narrow end of a taper 32, 34, the active waveguide core 30 always has a smaller cross-sectional area than the passive waveguide. The thickness of the active waveguide 30 can have values between $0.2\lambda$ and $4\lambda$. The simulations reported in FIG. 7 were carried out for a thickness of $~0.5\lambda$. Similarly, the width of the active waveguide at the narrow end of the taper can have values between $0.2\lambda$ and $4\lambda$. At the wide end of the taper, the width can be as large as $6\lambda$.

The thickness of the gap between the waveguide cores can vary between zero (direct contact between cores 20, 30) and $4\lambda$, i.e., between 0.0 and 5.0 μm in practice. The coupling efficiency for the signal reduces as the gap thickness increases. On the other hand, the extinction ratio of the pump at the output increases with the gap thickness. Preferred values of the gap thickness are approximately equal to $\lambda$.

The length of the amplifier portion 33 (excluding the couplers 32, 34) depends, in practice, on the material gain, confinement factor and the gain target. For example, quantum dots typically have a material gain of ~100 cm−1. Assuming a confinement factor of 50% with a 5% of quantum dot concentration, a gain of 10 dB is achievable at a length of ~1 cm. As another potential gain material, Er3+ has a significantly lower material gain, which means that longer waveguides are required to obtain an equal amount of gain. Because of the large variability of the active material and the confinement factor, the length of the amplifier can be in a broad range, e.g., from 100 μm up to 100 cm, but preferably between a few hundred micrometers and a few centimeters. If necessary, bends or spirals can be integrated into the amplifier to increase the length.

With regard to materials, passive waveguides can be made of low-loss dielectrics such as polymers, silicon nitride, and silicon oxide or silicon oxynitride. For the active waveguides, nanocrystals can be simply mixed with a polymer. The fabrication process of active waveguides made of nanocrystal-doped polymers is similar to that of passive polymer waveguides.

Among other active materials, colloidal nanocrystals have a very broad absorption spectrum. Such characteristic differentiates them from molecules or rare-earth materials, which usually exhibit a relatively narrow absorption band. Moreover, the emission energy can be easily tuned by quantum confinement effect. Particularly good results have been obtained with PbS/CdS quantum dots and with CdSe/CdS core/shell quantum dots. Clear amplification has been observed at room temperature and under ambient condition with typical material gain as high as 200 cm−1.

The active and passive waveguides can be stacked vertically, along with necessary cladding layers, using known deposition methods, such as spin coating, doctor blading, ink jet printing, and spray coating for polymer-based waveguides. Waveguides made of different materials, such as silicon oxynitride and silicon dioxide, can be fabricated using known material deposition (e.g. chemical vapor deposition) and waveguide formation (e.g. etching) methods. The amplifier 100 disclosed herein can be fabricated completely using known methods.

While the present invention has been described with reference to a limited number of embodiments, variants and the accompanying drawings, it will be understood by those skilled in the art that various changes can be made and equivalents can be substituted without departing from the scope of the present invention. In particular, a feature (device-like or method-like) recited in a given embodiment, variant or shown in a drawing can be combined with or replace another feature in another embodiment, variant or drawing, without departing from the scope of the present invention. Various combinations of the features described in respect of any of the above embodiments or variants can accordingly be contemplated, that remain within the scope of the appended claims. In addition, many minor modifications can be made to adapt a particular situation or material to the teachings of the present invention without departing from its scope. Therefore, it is intended that the present invention not be limited to the particular embodiments disclosed, but that the present invention will include all embodiments falling within the scope of the appended claims. In addition, many other variants than explicitly touched above can be contemplated. For example, other materials than those explicitly cited could be involved to obtain similar or substantially the same technical effects.

The invention claimed is:

1. An optically pumpable waveguide amplifier device, comprising:
    a cladding material;
    a passive optical waveguide embedded in the cladding material that has no optical amplification functionality; and
    an active optical waveguide having a gain material with a higher refractive index than the passive optical waveguide, and which successively includes: an input portion, a middle portion, and an output portion,
wherein the middle portion successively includes: a first taper portion, an amplifier portion, and a second taper portion; the middle portion embedded in the cladding material, and facing the passive waveguide, such that a lower surface of the middle portion faces an upper surface of the passive optical waveguide; and
    each of the taper portions widens towards the amplifier portion, parallel to the lower surface, such that a narrow end of each of the taper portions have a cross-sectional area that is smaller than a cross-sectional area of the passive optical waveguide at the same level of narrow end.

2. The optical waveguide amplifier device of claim 1, wherein a width of each of the taper portions decreases non-linearly from the amplifier portion, parallel to the lower surface.

3. The optical waveguide amplifier device of claim 2, wherein each of the taper portions decomposes into at least two sub-portions, including at least one slowly-varying sub-portion and at least one fast-varying sub-portion.

4. The optical waveguide amplifier device of claim 1, wherein the distance between the lower surface and the upper surface is between 0.0 and 5.0 μm.

5. The optical waveguide amplifier device of claim 1, wherein the passive optical waveguide is a rib waveguide, comprising: a slab and a strip, the strip being superimposed directly onto the slab, and wherein the upper surface of the passive optical waveguide is an upper surface of the slab, opposite to the strip with respect to the slab.

6. The optical waveguide amplifier device of claim 1, wherein a length of the taper portions is between 50 μm and 10 mm.

7. The optical waveguide amplifier device of claim 1, wherein a length of the amplifier portion is between 100 μm and 100.00 cm.

8. The optical waveguide amplifier device of claim 1, wherein the gain material comprises: a dispersion of dye molecules, rare-earth ions or nanocrystals embedded in a polymer.

9. The optical waveguide amplifier device of claim 8, wherein the gain material comprises: a colloidal dispersion of nanocrystals in a core or core-shell configuration, the nanocrystals selected from a group consisting of: group II-VI, IV-VI, III-V or IV semiconductor materials.

10. The optical waveguide amplifier device of claim 1, wherein the gain material comprises: a dispersion of $Er^{3+}$ ions.

11. The optical waveguide amplifier device of claim 1, wherein the refractive index contrast between the passive optical waveguide and the cladding material is between 0.005 and 0.02.

12. The optical waveguide amplifier device of claim 1, wherein the device comprises: no filter or demultiplexer to separate a pump signal from a signal to be amplified.

13. The optical waveguide amplifier device of claim 1, wherein the passive optical waveguide comprises: two taper portions that narrow inwardly and parallel to the upper surface of the middle portion of the active optical waveguide, and wherein each taper portion faces the corresponding first taper portion and second taper portion of the middle portion in the reverse orientation.

14. The optical waveguide amplifier device of claim 13, wherein the passive optical waveguide decomposes into two passive waveguide components, wherein the first component terminates at the narrow end of the first taper portion of the passive optical waveguide and the second component terminates at a narrow end of the second taper portion of the passive optical waveguide.

15. The optical waveguide amplifier device of claim 8, wherein the nanocrystals are quantum dots or quantum rods.

16. The optical waveguide amplifier device of claim 2, wherein each of the taper portions decomposes into three consecutive sub-portions, comprising:
    a fast-varying sub-portion;
    a slowly-varying sub-portion; and
    a second fast-varying sub-portion.

* * * * *